(12) United States Patent
Crocker

(10) Patent No.: US 6,394,023 B1
(45) Date of Patent: May 28, 2002

(54) PROCESS KIT PARTS AND METHOD FOR USING SAME

(75) Inventor: Steven C. Crocker, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/536,263

(22) Filed: Mar. 27, 2000

(51) Int. Cl.[7] .............................................. G01D 21/00
(52) U.S. Cl. ...................................... 116/208; 116/201
(58) Field of Search ................................ 116/200, 201, 116/206, 208; 118/712; 927/8, 9, 445

(56) References Cited

U.S. PATENT DOCUMENTS

| | | | | |
|---|---|---|---|---|
| 3,842,792 A | * | 10/1974 | Souther | 116/208 |
| 4,074,742 A | * | 2/1978 | Chamblin | 152/154.2 |
| 4,103,539 A | * | 8/1978 | Worley | 116/208 |
| 5,228,478 A | * | 7/1993 | Kleisle | 116/208 |
| 5,293,648 A | * | 3/1994 | Finley | 116/206 |
| 5,516,367 A | | 5/1996 | Lei et al. | |
| 5,558,717 A | * | 9/1996 | Zhao et al. | 118/715 |
| 5,655,475 A | * | 8/1997 | Crandell et al. | 116/208 |
| 5,800,856 A | * | 9/1998 | Hong Vuong | 427/9 |
| 5,947,053 A | * | 9/1999 | Burnham et al. | 116/208 |
| 6,071,353 A | * | 6/2000 | Gallagher | 134/2 |
| 6,106,661 A | * | 8/2000 | Reader et al. | 156/345 |
| 6,250,295 B1 | * | 6/2001 | Chanton et al. | 116/208 |

FOREIGN PATENT DOCUMENTS

| | | | |
|---|---|---|---|
| DE | 34 15 192 A1 | 1/1985 | |
| GB | 2286003 A | * 2/1995 | ............ B28D/1/26 |
| JP | 10090834 | 4/1998 | |
| WO | 98/42474 | 10/1998 | |
| WO | 98/58098 | 12/1998 | |

OTHER PUBLICATIONS

Anonymous: "Scribed Alignment Mark" IBM Technical Disclosure Bulletin, vol. 26, No. 5, Oct. 1, 1983, pp. 2526–2527, XP–002177325, New York.

* cited by examiner

Primary Examiner—Diego Gutierrez
Assistant Examiner—R. Alexander Smith
(74) Attorney, Agent, or Firm—Dugan and Dugan

(57) ABSTRACT

A recyclable process kit part is provided with a visible mark. After the part undergoes a cleaning process that removes deposited material therefrom, the part can be determined to be within tolerance, based on the mark's visibility. More specifically, the recyclable process kit part is made of a material, and has a first surface that has a first elevation. A visual mark is formed in the first surface, and extends to a second elevation, wherein the distance between the first elevation and the second elevation is adapted such that the mark is visible until an amount of the material is removed from the part so as to make the part nearly out of tolerance.

22 Claims, 7 Drawing Sheets

PROCESS KIT PARTS AND METHOD FOR USING SAME

FIELD OF THE INVENTION

The present invention relates to a part which is used in semiconductor fabrication processes, and more particularly, to the use of a part having a visual indicator which identifies the end of the part's useful life.

BACKGROUND OF THE INVENTION

A semiconductor device is formed by layering various materials on a wafer in a prescribed pattern. Popular methods for depositing semiconductor layers include physical vapor deposition and chemical vapor deposition. While these processes are effective for film formation, material that deposits on surfaces within the deposition chamber other than those of the substrate may tend to flake or crumble from chamber surfaces as the chamber thermally cycles (e.g., deposition chambers are heated to temperatures typically between 150° C. to 500° C. during wafer processing, and allowed to cool between sequentially processed wafers), particularly when a significant amount of material has accumulated. Such flaking or crumbling may cause wafer contamination. Accordingly, in order to reduce this type of contamination, chamber surfaces must be periodically cleaned or replaced. To reduce the cost per article processed, such part replacement should be minimized and cleaning procedures simplified. One technique for simplifying chamber cleaning is to use process kits (e.g., chamber components such as shields, pedestals, shutters, collimators and clamp rings (as described below) which may be easily removed from the chamber for cleaning or replacement.

Typically, once removed from the chamber, process kit parts are cleaned via submersion in a chemical solution which etches the deposited material from the part. Additionally, some components may require bead blasting or other abrasive techniques to physically remove deposited material from the part. Both chemical and physical removal of deposited materials inevitably removes (e.g., etches or blasts away) a portion of the part's surface. After several cleanings, a portion of the part's surface may be removed to the extent that the part no longer falls within the range of acceptable dimensions (i.e., part tolerance) required for the part to perform its intended function (e.g., a clamp ring should uniformly press a wafer against the susceptor, an edge ring should uniformly cover a wafer's perimeter, a collimator, shield and shutter should uniformly block deposited material from certain surfaces, etc.).

Accordingly, a part which is out of tolerance should be immediately replaced.

It is difficult to accurately determine whether a cleaned part is out of tolerance. Part tolerances are often too small to determine via visual inspection. Therefore, paradigms such as a maximum number of cleanings, followed by discarding of the part, are employed. However, as, the amount of material removed by each cleaning cycle may vary considerably, employing a recommended number of cleanings per useful life (e.g., each part may be cleaned five times) results in many parts being discarded while they are still functional. Because each part replacement increases wafer processing costs, manufacturers often resort to time consuming metrology methods such as measuring a part with calipers or other measurement tools to determine whether a part is out of tolerance. However, metrology methods are time consuming and labor intensive which makes them costly alternatives.

Accordingly, there is a need for an improved method and apparatus for determining whether a process kit part is out of tolerance.

SUMMARY OF THE INVENTION

The invention provides a process kit part that has a visual indicator formed in a surface that is to be subjected to a cleaning process. Specifically, the invention provides a recyclable process kit part made of a material, and having a first surface that has a first elevation; and a visual mark formed in the first surface, the mark extending to a second elevation, wherein the distance between the first elevation and the second elevation is adapted such that the mark is visible until an amount of the material is removed from the part so as to make the part nearly out of tolerance. The visual indicator may be a mark which extends above the main surface of the part, or a mark which extends below the main surface of the part. The structure comprising the mark is eroded during cleaning; the erosion of the mark is proportional to the erosion of the surfaces of the part which when sufficiently eroded yield an out of tolerance part.

A preferred method of using the part provides a processing chamber which contains the inventive part, and performing a process therein that results in deposition of material on the inventive part. The deposited material then is cleaned from the inventive part (such as via an etch process and/or a bead blasting process) which results in erosion of the part surfaces and the mark, and the part is determined to be within tolerance based on the mark's visibility.

With use of the present invention a part can be quickly determined to be within tolerance, and the use of time consuming metrology methods is reduced. Moreover, when the inventive mark's visibility is not clear, an operator is on notice that the part may be out of tolerance, and costly defects associated with out of tolerance parts may be avoided.

Other features and advantages of the present invention will become more fully apparent from the following detailed description of the preferred embodiments, the appended claims and the accompanying drawings.

DETAILED DESCRIPTION OF THE PREFERRED EMBODIMENTS

Figure 1A:
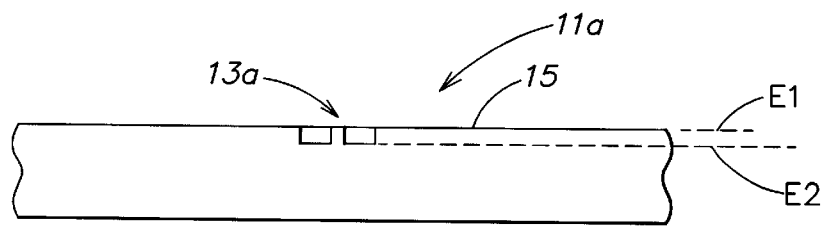
FIGS. 1A and 1B are a side view and a top elevational view, respectively, of a visible mark portion of a recyclable process kit part configured in accordance with a first aspect of the invention.
Figure 1B:
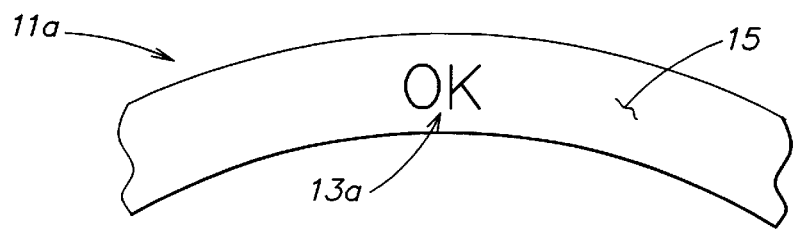

FIGS. 1A and 1B are a side view and a top elevational view, respectively, of a visible mark portion of a recyclable process kit part 11a configured in accordance with a first aspect of the invention. The part 11a has a visible mark 13a comprising the word "OK". Although the visible mark "OK" is preferred as its meaning is widely recognized both in the United States and abroad, any visible mark (e.g., a line, symbol, word, letter, number, shape) may be employed. As shown in the embodiments of FIGS. 1A and 1B, the visible mark 13a is a recessed mark. Specifically, the part 11a has a first surface 15. The first surface 15 has a first elevation represented by line E1, and the visible mark 13a extends to a second elevation represented by line E2. The distance (E1–E2) between the first elevation and the second elevation (i.e., the mark's depth) is adapted such that the mark 13a is visible until an amount of material is removed from the part so as to make the part 11a nearly out of tolerance.

Methods for forming the mark 13a will be readily apparent to those of ordinary skill in the art, such as scribing (e.g., via laser, mechanical means, etching, etc.) or, for die cast parts, employing a die which has the visible mark formed therein. The mark's depth may be selected by making a first reference part having the mark (having a first reference depth) formed therein and subjecting the first reference part to a cleaning process which a non-reference part is to be exposed. The first reference part is preferably exposed to a number of cycles of the cleaning process. After each cycle the visibility of the mark is noted, and the part's critical surfaces are measured to determine whether the reference part is within tolerance. This data can then be employed to select a second reference depth for a mark formed on a second reference part, and to repeat the process described above until a mark depth is determined which results in a mark which is visible until an amount of material is removed from the part so as to make the part nearly out of tolerance. The optimal mark depth will vary based on the material of which the part is made, and the cleaning process to which the part is subjected. For example, a mark depth of 4 $\mu$m has been found appropriate for a deposition ring (described with reference to FIG. 1) made of titanium, and having a critical surface tolerance of 0.005 $\mu$m from a specified optimal measurement.

Figure 2A:
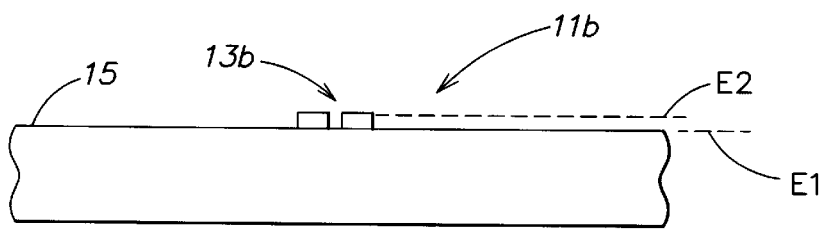
FIGS. 2A and 2B are a side view and a top elevational view, respectively, of a visible mark portion of a recyclable process kit part configured in accordance with a second aspect of the invention.
Figure 2B:
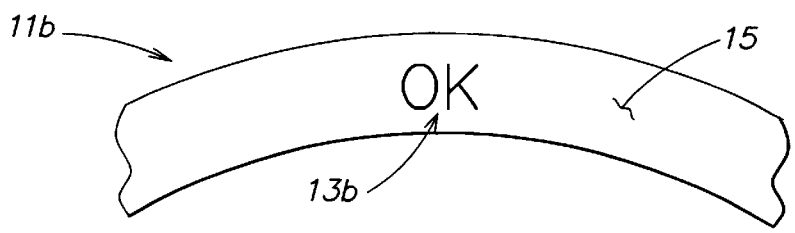

FIGS. 2A and 2B are a side view and a top elevational view, respectively, of a visible mark portion of a recyclable process kit 11b part configured in accordance with a second aspect of the invention. Like the part of FIGS. 1A and 1B, the part 11b has a visible mark 13b comprising the word "OK". However, unlike the mark of FIGS. 1A and 1B, the mark of FIGS. 2A and 2B is a raised mark. Specifically, the part 11b has a first surface 15. The first surface 15 has a first elevation represented by line E1, and the visible mark 13b extends to a second elevation represented by line E2. The distance (E1–E2) between the first elevation and the second elevation (i.e., the mark's depth) is adapted such that the mark 13b is visible until an amount of material is removed from the part 11b so as to make the part 11b nearly out of tolerance.

Methods for forming the mark 13b will be readily apparent to those of ordinary skill in the art, such as employing a die that has the visible mark formed therein. The appropriate depth of the mark 13b may be referentially determined as described above.

Figure 3:
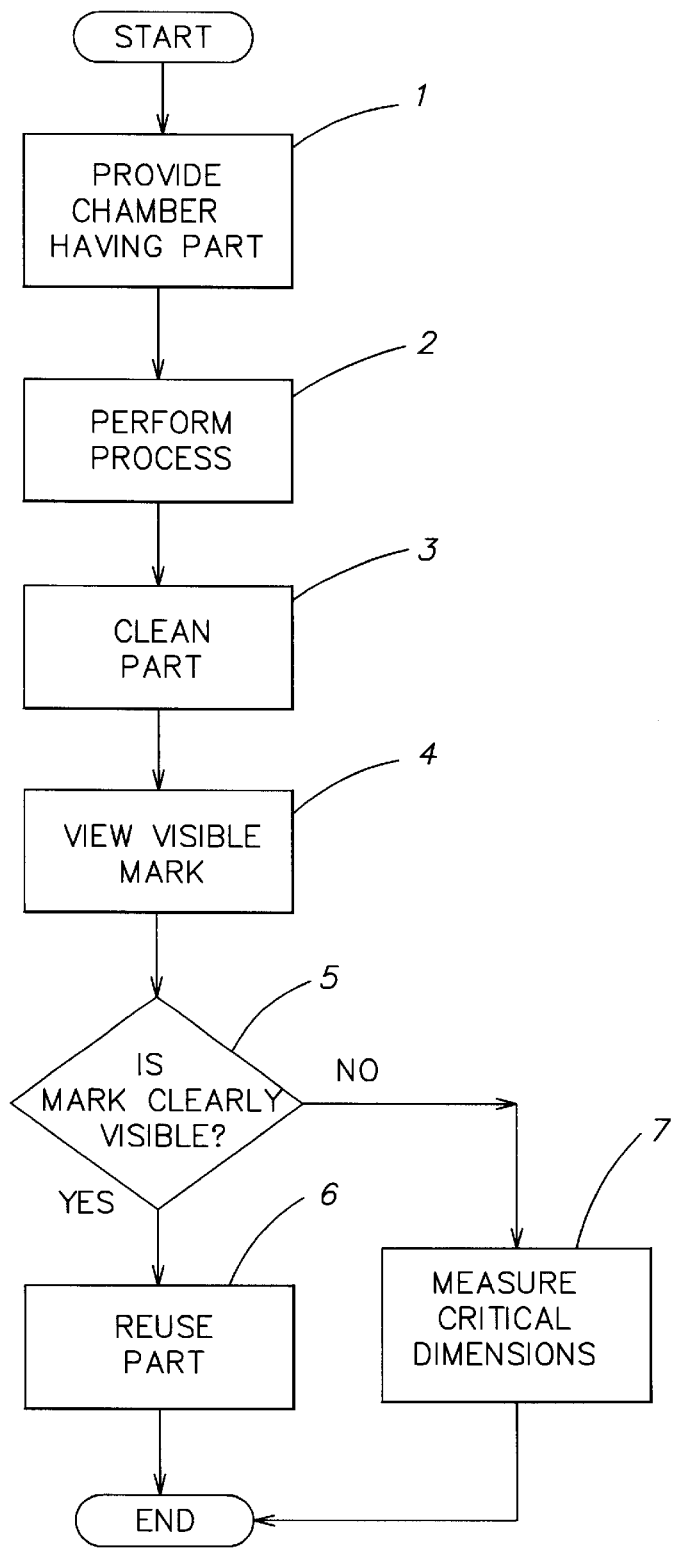
FIG. 3 is a flow diagram useful in describing an inventive method of determining part tolerance.

FIG. 3 is a flow diagram useful in describing an inventive method of using the parts of FIGS. 1A–B and 2A–B. As indicated by block 1, a processing chamber is provided which contains one or more inventive process kit parts having a visible mark as described above. The inventive process kit parts may be advantageously employed within any processing chamber that is adapted to perform a process which causes material to be deposited on the inventive process kit part. Exemplary chambers and processes include Applied Materials' PVD chamber™ which is adapted to perform sputter deposition of metal layers, and Applied Materials' Giga Fill™ chamber which is adapted to perform chemical vapor deposition of metal or oxide layers. Exemplary chambers and the specific process kit parts contained therein are described below with reference to FIGS. 4 and 5.

A process is then performed, one or more times within the processing chamber, such that material is deposited on the inventive part (block 2). Typically, an equipment manufacturer will provide guidelines which include the recommended number of wafers which can be processed within a specific chamber before a given process kit part will need cleaning. For example, the HDP chamber of FIG. 4 may deposit up to 600 $\mu$m of aluminum before process kit cleaning is needed.

After the recommended number of processing cycles has been performed while using the inventive process kit part, the inventive process kit part is removed and deposited material is cleaned therefrom (block 3). Generally cleaning involves placing the part in one or more chemical baths which etch the deposited material from the surface of the part. Occasionally, process kit parts are bead blasted to remove deposited material. An exemplary cleaning process for cleaning a deposited aluminum alloy from a titanium part is as follows:

| Step # | Step Name | Solution | Time |
|---|---|---|---|
| 1 | Etch | $H_3PO_4$ 85% stock weight 20 parts by volume $HNO_3$ 70% stock weight 5 parts by volume $H_2O$ 100% stock weight 1 part by volume | the process is complete when bubbling stops, takes days |

Note: Immerse in 60–70° solution; periodically scrubbing non-critical, non-delicate surfaces with Scotchbrite ™ may be helpful

| | | | |
|---|---|---|---|
| 2 | Rinse | Deionized water | 1 minute |

Note: Deionized water in immersion tank should be agitated (e.g., via Nitrogen) and overflowing, follow with 8 M$\Omega$ deionized water spray, be sure to spray areas which may trap fluid such as holes, weld spots, etc.

| | | | |
|---|---|---|---|
| 3 | Bright Dip | $HNO_3$ 20% HF 3% DI 77% | 10 seconds |
| 4 | Rinse | 2 M$\Omega$ room temperature deionized water | 2–3 minutes |

Note: Deionized water in immersion tank should be agitated (e.g., via Nitrogen) and overflowing, follow with 8 M$\Omega$ deionized water spray, be sure to spray areas which may trap fluid, holes, weld spots, etc.

| | | | |
|---|---|---|---|
| 5 | Warm Rinse | 4 M$\Omega$ 3q° C. deionized water preferably followed by a 8 m$\Omega$ 38° C.–46° C. deionized water spray | |

Note: Deionized water immersion tank should be agitated and overflowing

| | | | |
|---|---|---|---|
| 6 | Dry (immediately upon completion of step 5) | | as quickly as possible |

Note: Use Nitrogen gun set at 70–80 psi, blow out holes first working from the center to the edge of the part.

As discussed previously, these cleaning methods also remove some of the material of which the part is made. Therefore, after a number of cleaning cycles the inventive part may be out of tolerance, such that the part's critical dimensions (described with reference to FIGS. 4 and 5) no longer fall within the range of acceptable dimensions. Typically, the manufacturer of the deposition chamber provides its customers with a range of acceptable process kit dimensions. Accordingly, after an inventive part is cleaned, the mark is viewed (block 4) and, based on the mark's visibility, a determination is made as to whether the part is within tolerance (block 5). If the m ark i s clearly visible, the part is determined to be within tolerance and is returned to the processing chamber for reuse (block 6). If the m ark is not clearly visible, the part may be measured to determine whether or not it is within tolerance (block 7). A part which is not within tolerance is replaced. Alternatively, to avoid measurement time, a part may be replaced whenever the mark is not clearly visible.

The inventive method allows a part which may be out of tolerance to be quickly and easily identified. Processing chambers which use one or more of the inventive parts therefore may experience reduce d operating costs.

Figure 4A:
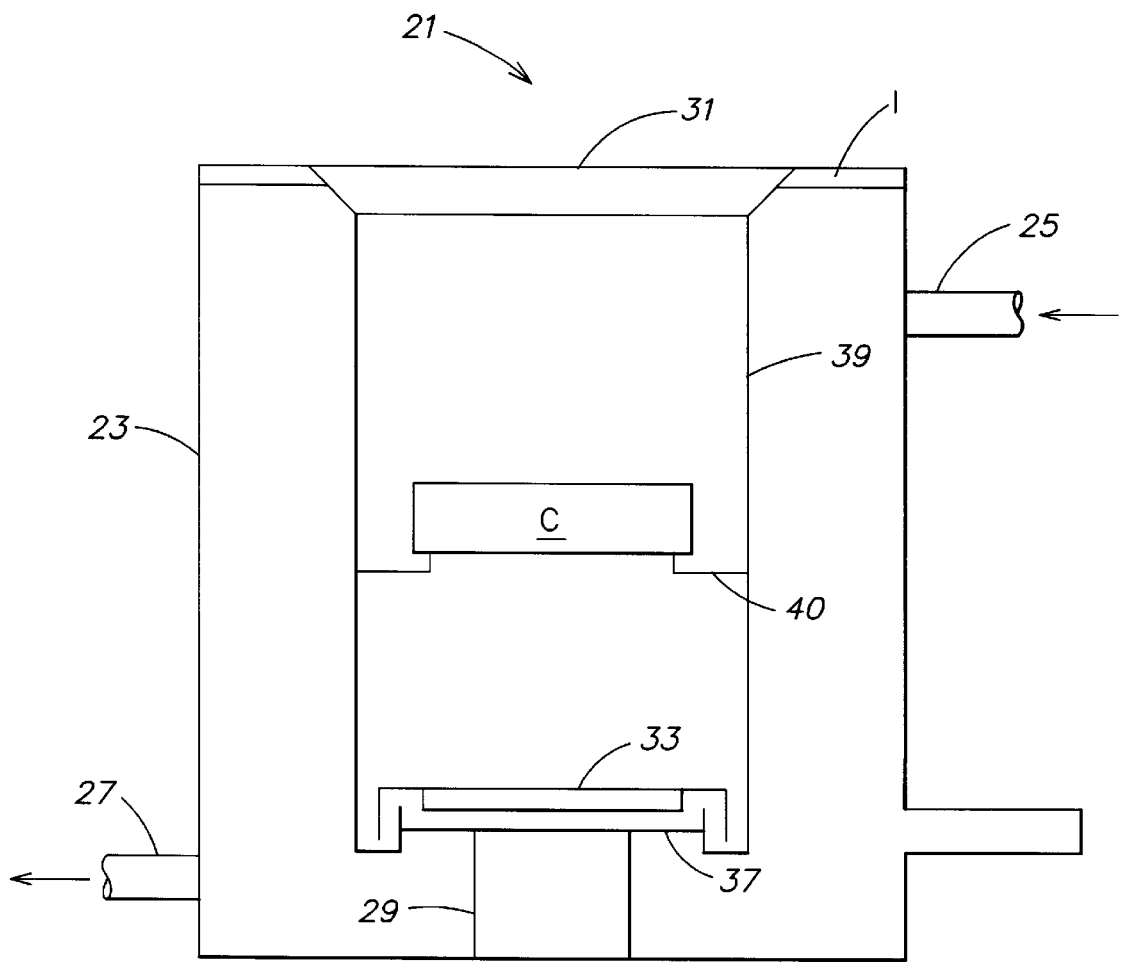
FIGS. 4A and 4B are schematic cross-sectional views of a processing chamber configured for physical vapor deposition.
Figure 4B:
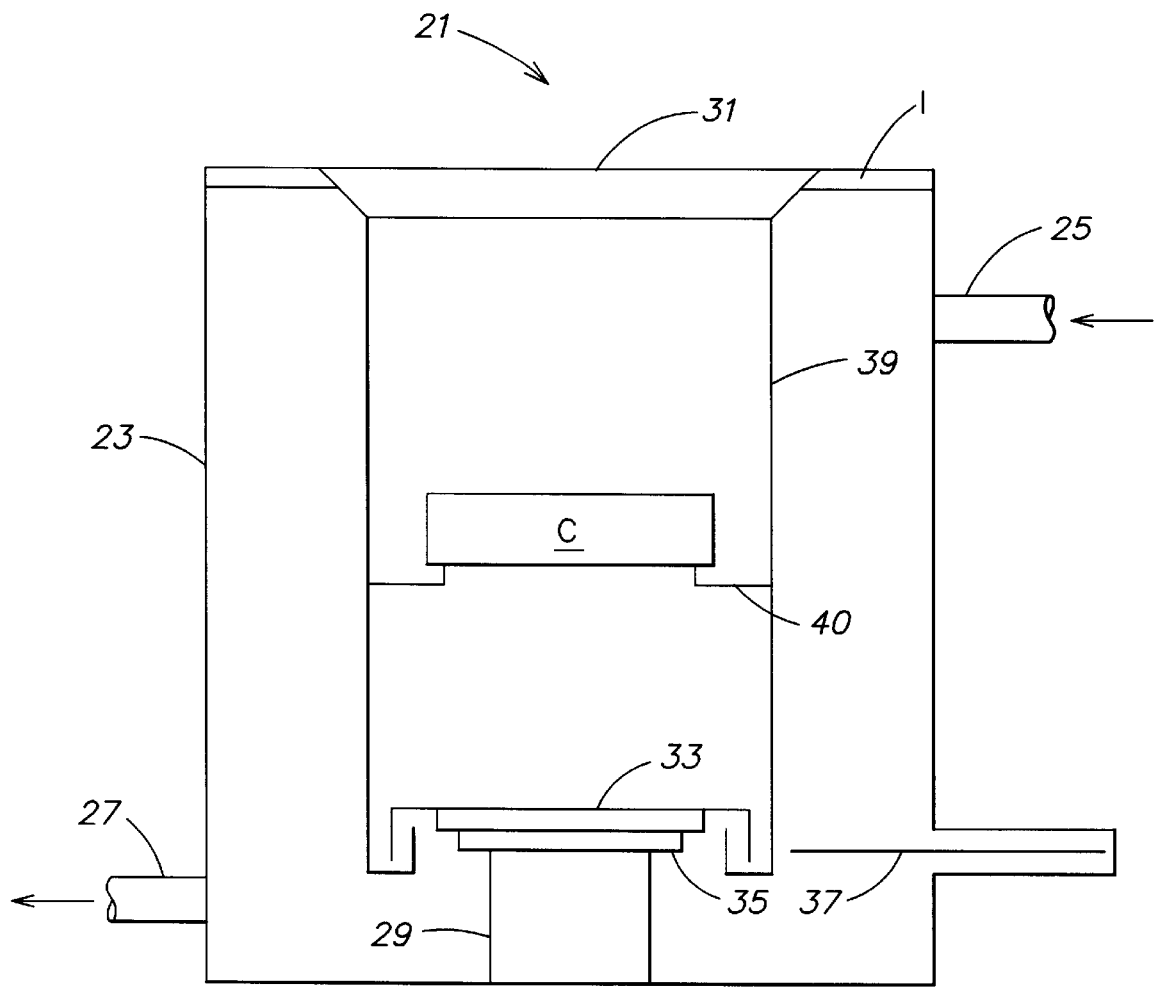

FIGS. 4A and 4B are diagrammatic illustrations, in section, of the pertinent portions of an exemplary sputtering chamber 21 which may employ the inventive part of FIGS. 1A–2B. The sputtering chamber 21 generally includes a vacuum chamber enclosure wall 23 having at least one gas inlet 25 and an exhaust outlet 27 connected to an exhaust pump (not shown). A substrate support 29 is disposed at the lower end of the sputtering chamber 21, and a sputtering target 31 is mounted to the upper end of the sputtering chamber 21. A clamp ring 33 is operatively coupled to the substrate support 29 so as to press a substrate 35 (see FIG. 4B) uniformly against the substrate support 29. A shutter assembly (not shown) is rotatably mounted within the sputtering chamber 21 for selectively positioning a shutter disk 37 between the target 31 and the remainder of the sputtering chamber 21 (i.e., placing the shutter disk 37 in a closed position). Thus when positioned in the closed position deposition material is prevented from depositing on surfaces beneath the shutter disk 37.

Preferably the shutter disk 37 is positioned so as to be between the clamp ring 33 and the substrate support 29 when the shutter disk 37 is in the closed position (as shown in FIG. 4A). A shield 39 is coupled along the edge of the target 31 and may extend to the substrate support 29 (or to a position somewhere between the target and substrate support) so as to limit the travel of deposition material. A collimator C (e.g., a tube or a screening plate) which blocks sputtered material that travels toward the substrate 35 along an undesirable trajectory may be mounted between the target 31 and the substrate support 29 (via a lip 40) which may extend from the enclosure wall 23 or from the shield 39.

The target 31 is electrically isolated from enclosure wall 23 e.g., via an insulating ring I. Enclosure wall 23 is preferably grounded so that a negative voltage may be maintained on the target 31 with respect to grounded enclosure wall 23. FIG. 4B shows the sputtering chamber 21 of FIG. 4A with the shutter disk 37 in the open position, and with the clamp ring 33 pressing the substrate 35 against the substrate support 29.

The shutter disk 37, the shield 39, the collimator C and the clamp ring 33 are removable process kit parts which may include a visible mark as described with reference to FIGS. 1A–2B.

Figure 5A:
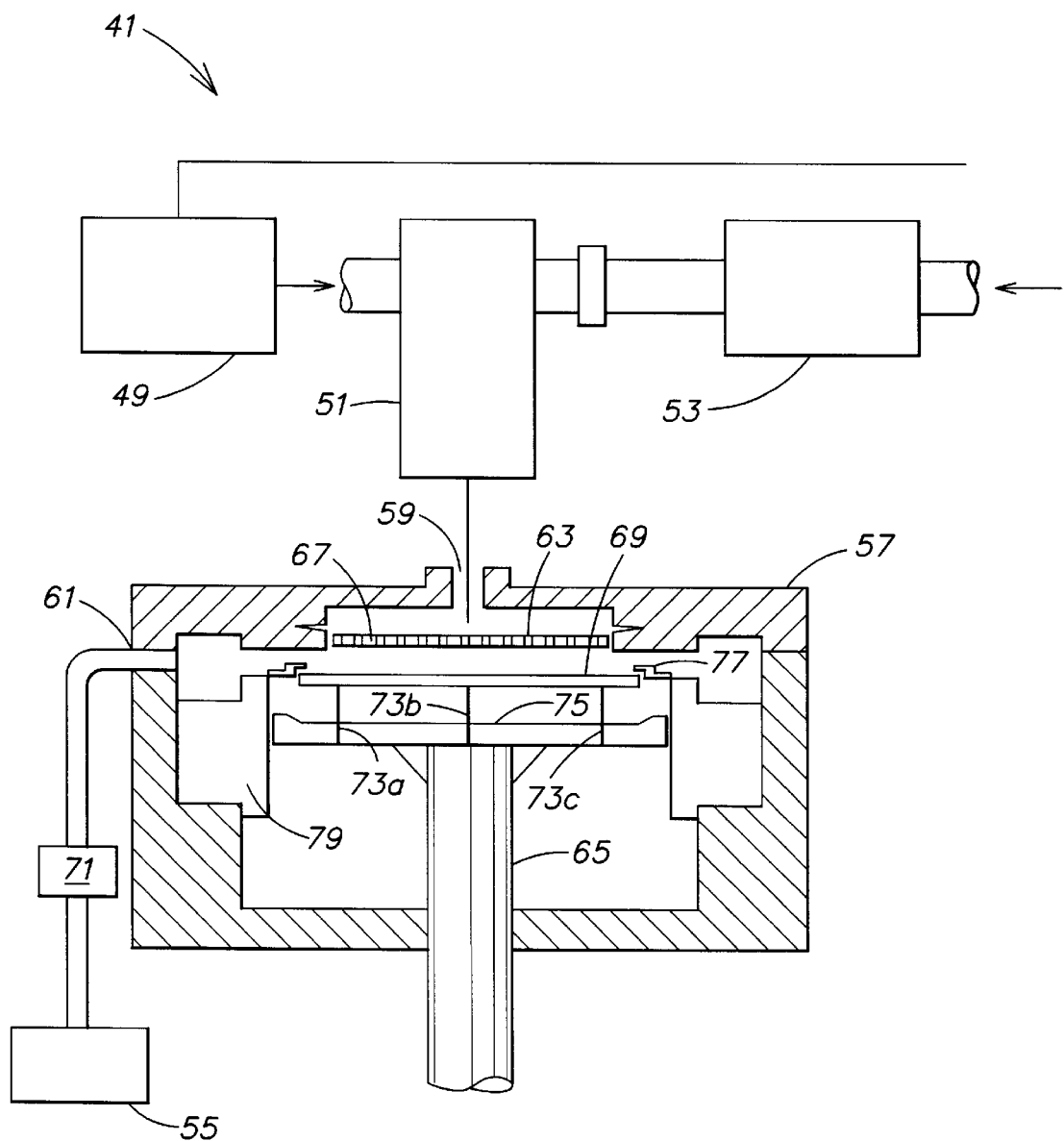
FIGS. 5A and 5B are a schematic cross-sectional views of a processing chamber configured for chemical vapor deposition.

FIG. 5A is a schematic side sectional view of a CVD system 41 configured in accordance with the invention. The CVD system 41 is suitable for performing processes such as 10 deposition of oxide layers, etching, etc. Generally, the CVD system 41 comprises a gas supply system 49, a gas mixing box 51, a plasma generation system 53, a vacuum system 55, and a chamber 57 having a gas/plasma inlet 59 along the top thereof and having an outlet 61. The chamber 57 contains a gas distribution plate 63 and a substrate support 65.

The gas mixing box 51 is coupled to the chamber 57 via the gas/plasma inlet 59 which introduces gases from the gas mixing box 51 to the backside of the gas distribution plate 63. The gas distribution plate 63 has a plurality of small orifices 67 that disperse gas flowing from the gas/plasma inlet 59 to a substrate 69 positioned on the substrate support 65. The vacuum system 55 is coupled to the chamber 57 via the outlet 61, and via a throttle valve 71.

The substrate support 65 preferably also functions as a heater and therefore includes an electrically resistive heating element (not shown). Further, the substrate support 65 is vertically movable between a lower, wafer exchange position shown in FIG. 5A and an upper, processing position shown in FIG. 5B.

The substrate support 65 includes a plurality of substrate lift pins 73a–c; preferably four such pins are equally spaced radially along a substrate contacting surface 75 of the substrate support 65, such that the blade of a conventional wafer handler (not shown) easily fits between the substrate lift pins 73a–c. The substrate lift pins 73a–c are slidably coupled to the substrate support 65, such that the substrate lift pins 73a–c remain stationary as the substrate support 65 moves between the upper position (FIG. 5B) and the lower position (FIG. 5A). Thus, relative to the substrate support 65, the substrate lift pins 73a–c appear to extend (FIG. 5A) and retract (FIG. 5B) from the substrate contacting surface 75.

An optional edge ring 77 is supported by a lip 79 which extends inwardly from the walls of the chamber 57 and supports the edge ring 77 so that the edge ring 77 surrounds and/or overlaps the edge of the substrate 69 when the substrate support 65 is elevated to the processing position. The edge ring 77 is employed to control or prevent deposition on the edge of the substrate 69 during processing. The edge ring 77 may be configured to overlap the edge of the substrate 69 (conventionally referred to as a shadow ring) or to surround the edge of the substrate 69 leaving only a narrow space between the edge of the substrate 69 and the edge ring 77 (conventionally referred to as a purge ring). A purge gas may then be delivered through the narrow space to prevent a deposition gas from reaching the substrate's edge. Alternatively the edge ring 77 may comprise a ring which is coupled to a vacuum pumping mechanism (conventionally referred to as a shutter ring), and a purge gas ring which is coupled to a source of purge gas. Thus, the two rings provide a purge gas inlet and outlet adjacent the substrate's edge so as to guide the purge gas across the wafer's edge. In order for the edge ring 77 to work effectively for shadowing and particularly for purging, the edge ring 77 must be frequently cleaned to remove deposition material which can alter the gap between the ring and the substrate's edge (if the edge ring 77 is configured as a purge ring) or the overlap between the ring and the substrate's edge (if the edge ring 77 is configured as a shadow ring).

In operation, the CVD system 41 is pumped down to a desired vacuum pressure and the substrate support 65 lowers to the wafer exchange position (FIG. 5A), such that the substrate lift pins 73a–c extend from the substrate contacting surface 75. A slit valve (not shown) opens, and a wafer handler (not shown) carrying the substrate 69 extends through the slit valve and positions the substrate 69 just above the substrate lift pins 73a–b. The substrate lift pins 73a–b then raise, transferring the substrate 69 from the wafer handler (not shown) to the substrate lift pins 73a–b.

After the wafer handler retracts through the slit valve (not shown) and the slit valve closes, the substrate support 65 elevates to the deposition position (FIG. 5B) such that the substrate lift pins 73a–c are level with the substrate contacting surface 75, and maintain contact with the substrate 69. As the substrate support 65 elevates the substrate lift pins 73a–c in effect "lower" until the substrate 69 gently contacts the substrate contacting surface 75 which preferably conducts heat (from heating elements, not shown) to the substrate 69.

After the substrate support 65 reaches the processing position (FIG. 5B), the substrate support 65 is heated to the processing temperature (e.g., 350–600° C. for a CVD $SiO_2$ deposition) and the gas mixing box 51 provides reactive gases from the gas supply system 49 through the gas/plasma inlet 59 to the backside of the gas distribution plate 63. For instance, for a CVD silicon dioxide deposition the reactive gasses typically include TEOS ($Si(OC_2H_5)_4$) and ozone ($O_3$).

The gasses flow through the orifices 67 in the gas distribution plate 63 and react at the heated surfaces of the substrate 69 positioned on the substrate support 65. A uniform CVD $SiO_2$ film thereby deposits on the top surface of the substrate 69. If the optional edge ring 77 is employed, the edge ring 77 prevents deposition on the edge of the substrate 69, either by overlapping the edge of the substrate 69 or by directing purge gas along the edge of the substrate 69.

Following deposition of the CVD $SiO_2$ film the substrate support 65 lowers to the wafer exchange position (FIG. 5A), such that the substrate lift pins 73a–c extend above the substrate contacting surface 75 and the substrate support 65 lowers the substrate away from the edge ring 77 which is stationarily supported by the lip 79 that extends inwards from the chamber 57. The slit valve (not shown) opens and a wafer handler (not shown) extends therethrough to extract the substrate 69 from the extended substrate lift pins 73a–c.

During processing material may deposit on both the edge ring 77, as well as on the gas distribution plate 63. Accordingly, the edge ring 77 and the gas distribution plate 63 may be inventive process kit parts configured as described with reference to FIGS. 5A–2B, which may be removed from the chamber and cleaned. The inner circumference of the edge ring 77 and the inner circumference of the orifices 67 in the gas distribution plate 63 may be critical dimensions whose tolerance the present invention may assist an operator in determining.

Figure 5B:
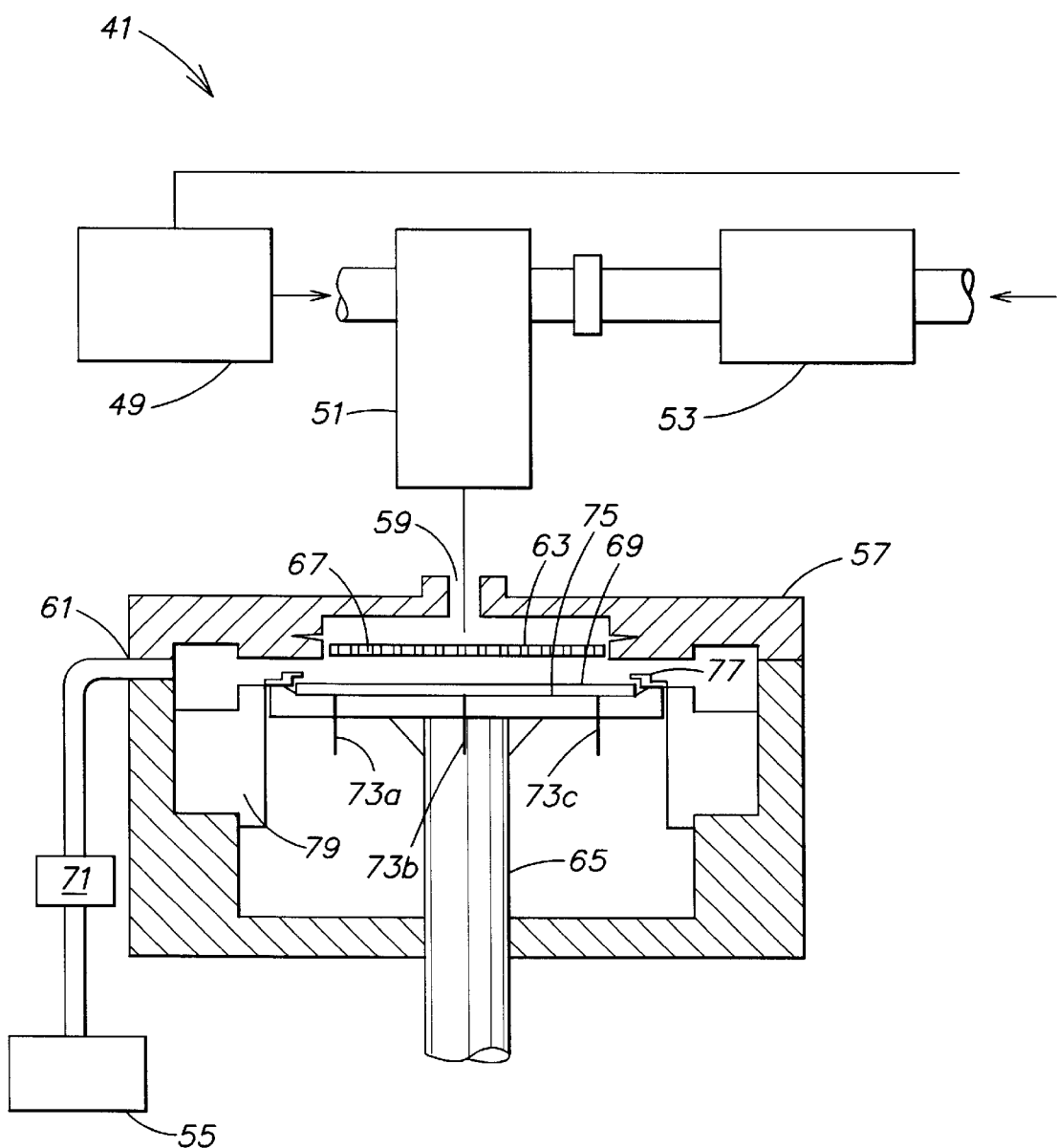
Figure 6:
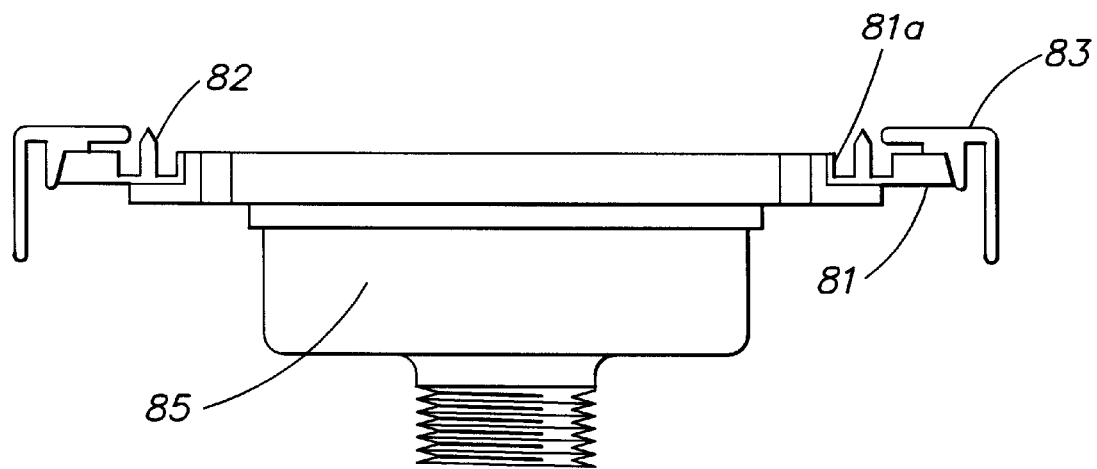
FIG. 6 is a schematic side view of additional process kit rings that may be used in the chambers of FIGS. 4A–5B.

FIG. 6 shows additional process kit rings which may be used in the chamber of FIGS. 4A–B as an alternative to the clamp ring 33 or in the chamber of FIGS. 5A–B as an alternative to the edge ring 77. Specifically, FIG. 6 shows schematic side view of a deposition ring 81 (which may include wafer restriction pins 82 that prevent a wafer from moving therebeyond) and a cover ring 83. The deposition ring 81 is designed primarily to prevent deposition on the side of a substrate support 85, as the substrate support 85 may not be easily removed from the chamber for cleaning. Accordingly, a critical dimension of the deposition ring 81 is the height of a lip portion 81a which extends along the edge of the substrate support 85. The cover ring 83 is designed to allow gas passage while shielding chamber components from deposition. The deposition ring 81 and the cover ring 83 are removable process kit parts which may include a visible mark as described with reference to FIGS. 1A–2B.

The foregoing description discloses only the preferred embodiments of the invention, modifications of the above disclosed apparatus and method which fall within the scope of the invention will be readily apparent to those of ordinary skill in the art. For instance, other chamber configurations which may be adapted to perform other processes (etch, photolithography, etc.) and which may require process kit parts other than those described above, may benefit from process kit parts configured in accordance with the invention. In fact, any chamber which performs a process that causes a material to deposit on chamber parts, and that requires periodic part cleaning may benefit from the inventive parts described herein as may equipment or processes which result in material removal from parts (e.g., etch, chemical mechanical polishing, etc.).

Accordingly, while the present invention has been disclosed in connection with the preferred embodiments thereof, it should be understood that other embodiments may fall within the spirit and scope of the invention, as defined by the following claims.

The invention claims is:

1. An apparatus comprising:
   a recyclable process kit part made of a first material and being adapted to be removably coupled inside a semiconductor fabrication process chamber, and further being adapted to have a second material deposited on the first material while the process kit part is inside the chamber, the process kit part further being adapted to be removed from the chamber and cleaned by a process which removes a portion of a surface of the process kit part, the process kit part having:
   a first surface that has a first elevation; and
   a visual mark formed in the first surface, the mark extending to a second elevation, wherein the distance between the first elevation and the second elevation is adapted such that the mark is visible until an amount of the first material is removed from the part so as to make the part nearly out of tolerance.

2. The apparatus of claim 1 wherein the second elevation is below the first elevation, such that the mark is below the first surface of the part.

3. The apparatus of claim 2 wherein the mark is a laser scribe mark.

4. The apparatus of claim 1 wherein the second elevation is above the first elevation, such that the mark is above the first surface of the part.

5. The apparatus of claim 4 wherein the mark is a molded mark.

6. The apparatus of claim 1 wherein the mark displays the word "OK".

7. The apparatus of claim 1 wherein the process kit part is adapted to be employed within the chamber when configured to perform a physical vapor deposition process.

8. The apparatus of claim 1 wherein the process kit part is adapted to be employed within the chamber when configured to perform a chemical vapor deposition process.

9. The apparatus of claim 1 wherein the process kit part is an edge ring adapted to prevent deposition of the second material on a side wall of a heater.

10. The apparatus of claim 1 wherein the process kit part is an edge ring adapted to prevent deposition of the second material on an edge of a substrate.

11. An apparatus comprising:
a process chamber adapted to deposit the second material on a substrate processed therein; and
the apparatus of claim 1 removably coupled within the processing chamber.

12. The apparatus of claim 11 wherein the processing chamber is adapted to perform a physical vapor deposition process.

13. The apparatus of claim 11 wherein the processing chamber is adapted to perform a chemical vapor deposition process.

14. A method comprising:
providing a processing chamber having a recyclable process kit part made of a first material, and having:
a first surface that has a first elevation; and
a visual mark formed in the first surface, the mark extending to a second elevation, wherein the distance between the first elevation and the second elevation is such that the mark is visible until an amount of the first material is removed from the part so as to make the part nearly out of tolerance;
performing a process within the processing chamber such that second material is deposited on the recyclable process kit part;
removing the recyclable process kit part from the processing chamber;
cleaning the deposited second material from the removed recyclable process kit part by a process which removes a portion of the first surface of the recyclable process kit part; and
determining whether the recyclable process kit part is within tolerance based on the mark's visibility.

15. The method of claim 14 wherein determining whether the recyclable process kit part is within tolerance based on the mark's visibility comprises:
if the mark is clearly visible determining the recyclable process kit part is within tolerance I.

16. The method of claim 15 wherein determining whether the recyclable process kit part is within tolerance based on the mark's visibility comprises:
if the mark is not clearly visible, then measuring the recyclable process kit part.

17. The method of claim 14 wherein cleaning the deposited material from the recyclable process kit part comprises etching the recyclable process kit part.

18. The method of claim 17 wherein etching the recyclable process kit part comprises submerging the recyclable process kit part in a bath.

19. The method of claim 14 wherein cleaning the deposited material from the recyclable process kit part comprises bead blasting the recyclable process kit part.

20. The method of claim 14 wherein performing a process within the processing chamber comprises performing a physical vapor deposition process.

21. The method of claim 14 wherein performing a process within the processing chamber comprises performing a chemical vapor deposition process.

22. The method of claim 14 wherein performing a process within the processing chamber comprises performing an etch process.

* * * * *